US009502620B2

(12) United States Patent
Cumpston

(10) Patent No.: US 9,502,620 B2
(45) Date of Patent: *Nov. 22, 2016

(54) COMPOSITE SUBSTRATE FOR LIGHT EMITTING DIODES

(71) Applicant: Xenio Corporation, San Francisco, CA (US)

(72) Inventor: Brian Cumpston, Pleasanton, CA (US)

(73) Assignee: Xenio Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,537

(22) Filed: Jan. 5, 2016

(65) Prior Publication Data
US 2016/0181480 A1 Jun. 23, 2016

Related U.S. Application Data

(63) Continuation of application No. 14/579,937, filed on Dec. 22, 2014, now Pat. No. 9,252,337.

(51) Int. Cl.
H01L 27/15 (2006.01)
H01L 29/88 (2006.01)
H01L 33/48 (2010.01)
H01L 33/62 (2010.01)
(Continued)

(52) U.S. Cl.
CPC ........... *H01L 33/486* (2013.01); *H01L 25/165* (2013.01); *H01L 25/167* (2013.01); *H01L 33/20* (2013.01); *H01L 33/507* (2013.01); *H01L 33/56* (2013.01); *H01L 33/58* (2013.01); *H01L 33/60* (2013.01); *H01L 33/62* (2013.01); *H01L 33/644* (2013.01); *H05K 1/0274* (2013.01); *H05K 1/181* (2013.01); *H01L 25/0753* (2013.01); *H01L 2224/48091* (2013.01); *H01L 2224/48137* (2013.01); *H01L 2224/49107* (2013.01); *H01L 2224/49109* (2013.01); *H01L 2224/73265* (2013.01); *H01L 2224/8592* (2013.01); *H01L 2924/181* (2013.01); *H05K 2201/0275* (2013.01); *H05K 2201/10106* (2013.01); *H05K 2201/10166* (2013.01)

(58) Field of Classification Search
CPC ..... H01L 33/486; H01L 33/58; H01L 33/60; H01L 33/62; H01L 25/165
USPC ........ 257/79, 88, 98, 103, E31.099, E33.001
See application file for complete search history.

(56) References Cited

U.S. PATENT DOCUMENTS 5,542,175 A 8/1996 Bhatt ............................. 156/247
7,786,492 B2 8/2010 Omae et al. .................... 257/81
(Continued)

Primary Examiner — Long K Tran
(74) Attorney, Agent, or Firm — Imperium Patent Works; Darien K. Wallace

(57) ABSTRACT

A low-cost device for packaging LED dies provides superior reflectivity and thermal conductivity without covering entire surfaces of an LED luminaire with an expensive reflective aluminum substrate. The LED packaging device includes a highly reflective substrate disposed in a hole in a printed circuit board. The substrate has a reflectivity greater than 97% and includes an insulating layer and a reflective layer disposed above a thicker aluminum layer. An LED die is disposed on the top surface of the substrate. The PCB has a layer of glass fiber in resin and a metal layer. The lower surface of the PCB and the bottom surface of the substrate are substantially coplanar. The metal layer of the PCB is electrically coupled to the LED die only through bond wires. Electronic circuitry is disposed on the upper surface of the PCB and is used to control light emitted from the LED die.

20 Claims, 10 Drawing Sheets

(51) Int. Cl.
*H01L 33/60* (2010.01)
*H01L 25/16* (2006.01)
*H05K 1/18* (2006.01)
*H05K 1/02* (2006.01)
*H01L 33/58* (2010.01)
*H01L 33/20* (2010.01)
*H01L 33/50* (2010.01)
*H01L 33/56* (2010.01)
*H01L 33/64* (2010.01)
*H01L 25/075* (2006.01)

(56) References Cited

U.S. PATENT DOCUMENTS

| | | | |
|---|---|---|---|
| 7,994,518 B2 | 8/2011 | Wang et al. | 257/82 |
| 8,049,244 B2 | 11/2011 | Chen et al. | 257/99 |
| 8,297,801 B2 | 10/2012 | Coushaine et al. | 362/329 |
| 8,536,607 B2 | 9/2013 | Chuang | 257/98 |
| 8,901,597 B2 | 12/2014 | Jeong | 257/99 |
| 8,941,134 B2 | 1/2015 | Loh | 257/93 |
| 2007/0145398 A1* | 6/2007 | Shin | H01L 33/483 257/98 |
| 2007/0164291 A1* | 7/2007 | Kim | H05K 1/0204 257/79 |

* cited by examiner

COMPOSITE SUBSTRATE FOR LIGHT EMITTING DIODES

CROSS REFERENCE TO RELATED APPLICATIONS

This application is a continuation of, and claims priority under 35 U.S.C.§120 from, nonprovisional U.S. patent application Ser. No. 14/579,937 entitled "A Composite Substrate for Light Emitting Diodes," now U.S. Pat. No. 9,252,337, filed on Dec. 22, 2014, the subject matter of which is incorporated herein by reference.

TECHNICAL FIELD

The present invention relates generally to packaging for light-emitting diodes, and more particularly, to a composite substrate that maintains high reflectivity and thermal conductivity at lower cost.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. Multiple LED dies are typically packages together in an LED array. In one example, an array of LED dies is mounted onto a heat conducting substrate, and a layer of silicone is disposed over the LED dies. When a current is driven through the LED dies, the dies emit blue light. Some of the blue light emitted from the LED dies is absorbed by phosphor particles embedded in the silicone and is re-emitted by the phosphor particles as longer wavelength light. The combined light emitted by the LED dies and phosphor particles has a wider band of wavelengths. Some of the emitted light does not, however, exit the LED package because the light is absorbed by surfaces of the package. Thus, a first desirable quality of LED packaging is having highly reflective surfaces that reflect as much light as possible from the LED package.

In addition, while emitting light, the LED dies and the phosphor particles also generate heat. The performance and operational lifetime of the LED dies is degraded if the operating temperature exceeds a threshold level. Empirical data demonstrates that there is an inverse relationship between the useful life of an LED die and the amount by which the average operating temperature exceeds a threshold level, such as 25 degrees Celsius. In order to remove enough heat from the LED dies so as to keep the LED dies adequately cool, the LED package is typically fixed in some way to a heat sink. Thus, a second desirable quality of LED packaging is effectively dissipating the heat generated by the LED dies.

And of course low cost is a third desirable quality of LED packaging. In an attempt to reduce the cost of LED packaging, bare LED dies can be attached directly to a large printed circuit board in a chip-on-board (COB) manner in order to eliminate the manufacturing step of mounting the dies onto smaller substrates that are themselves attached to the board. The overall cost can be reduced by transferring the manufacturing steps of die attaching, wire connecting and encapsulating to the circuit board assembly stage.

FIG. 1 (prior art) is a cross-sectional view of chip-on-board packaging 10 in which light-emitting diode (LED) dies 11-16 are directly mounted onto an aluminum substrate 17 that is covered by a reflective layer 18 and an insulating layer 19. Conductive traces 20 are deposited over the insulating layer 19, and bond wires 21 electrically connect contacts on the LED dies 11, 16 to the conductive traces 20. Subsequently, silicone 22 containing phosphor particles 23 is poured into a dam 24 and hardens forming a conformal covering over the LED dies 11-16. The silicone layer 22 also protects the bond wires 25. Although the chip-on-board packaging 10 does exhibit the two desired LED packaging qualities of effective heat dissipation and high reflectivity, the cost of using the highly reflective aluminum substrate as an entire surface of the LED luminaire is exceedingly expensive.

A low cost method of packaging LED dies is sought that provides superior reflectivity and thermal conductivity but yet reduces cost by avoiding covering entire surfaces of the LED luminaire with expensive highly reflective layers.

SUMMARY

A low-cost device for packaging LED dies provides superior reflectivity and heat conductivity without covering entire surfaces of a luminaire with expensive, highly reflective substrates. The LED packaging device includes a highly reflective substrate disposed in a hole in a printed circuit board. The highly reflective substrate has a reflectivity greater than 97% and includes an insulating layer and a reflective layer disposed above a thicker aluminum layer. LED dies are mounted directly to the top surface of the substrate. The printed circuit board has a layer of glass fiber in resin and a metal layer. The lower surface of the printed circuit board and the bottom surface of the substrate are substantially coplanar. The bottom surface of the substrate is thermally coupled to the upper surface of a heat sink through a thermal interface material. The metal layer of the printed circuit board is electrically coupled to the LED dies through bond wires, and no electrical connection is made to any LED die disposed on the top surface of the substrate except through bond wires.

Electronic circuitry is disposed on the upper surface of the printed circuit board and is used to control light emitted from the LED dies. For example, drive electronics disposed on the upper surface of the printed circuit board receives a higher voltage and supplies a lower voltage to the LED dies. The LED packaging device is covered by molded plastic or by a plastic encapsulant. The drive electronics is disposed between the upper surface of the printed circuit board and the inside surface of the molded plastic cover, or the drive electronics is conformally overmolded with the plastic encapsulant. A seal is created by a double-sided adhesive sheet that is disposed under the inside surface of the molded plastic cover and over the upper surface of the printed circuit board.

In one embodiment, the top surface of the substrate is lower than the upper surface of the printed circuit board, and a layer of silicone covers the substrate and the LED dies. Particles of phosphor are contained in the layer of silicone. In another embodiment, the top surface of the substrate and the upper surface of the printed circuit board are coplanar. In one embodiment, the highly reflective substrate is a disk that fits in a cylindrical hole in the printed circuit board. The printed circuit board has a lower indentation in the lower surface, and the substrate disk has a lower lip. The thickness of the lower lip of the substrate disk equals the depth of the lower indentation in the printed circuit board.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
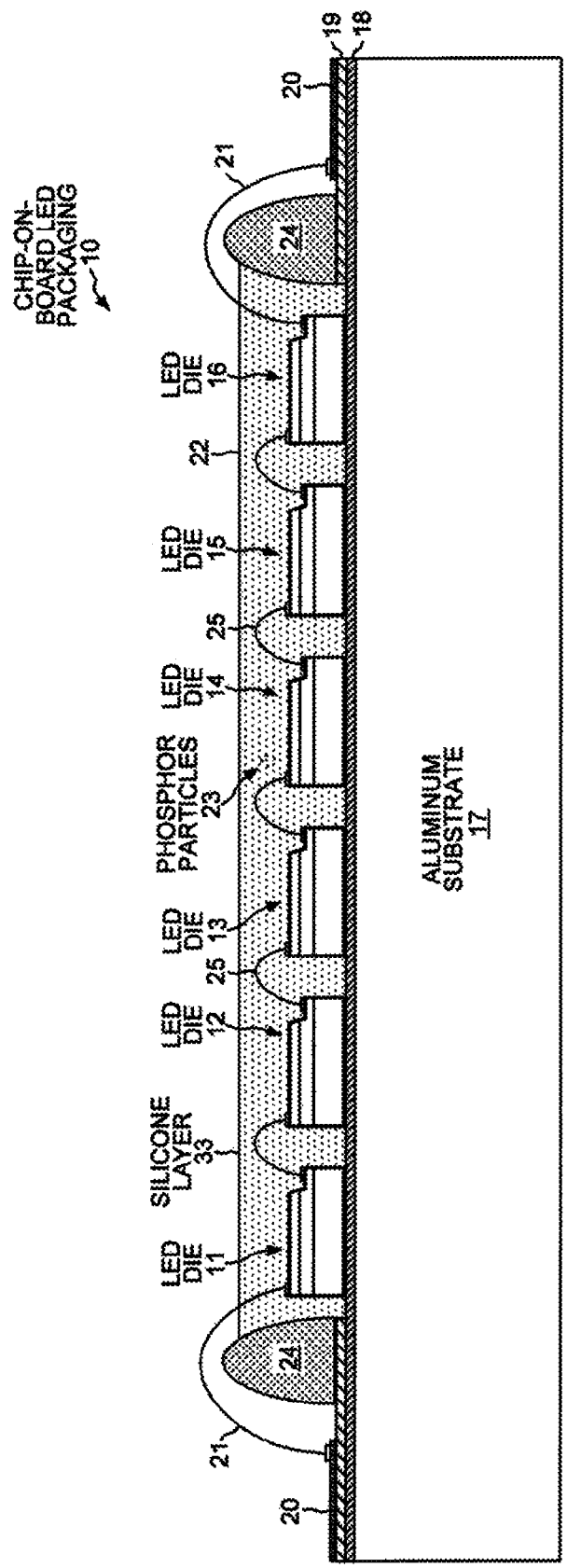
FIG. 1 (prior art) is a cross-sectional view of chip-on-board packaging with LED dies directly mounted onto a reflective aluminum substrate.
Figure 2:
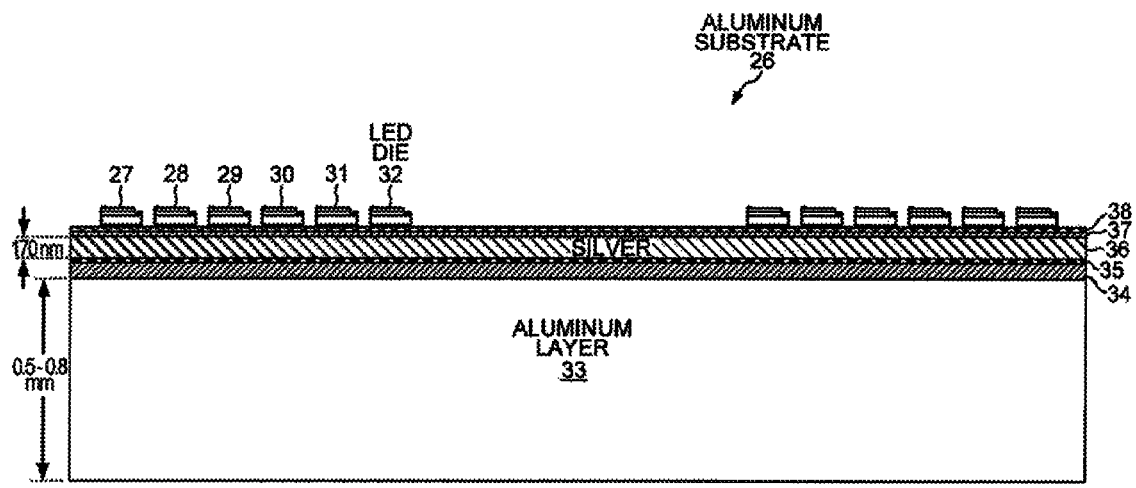
FIG. 2 is a cross-sectional view of a highly reflective aluminum substrate onto which LED dies have been mounted in a chip-on-board (COB) manner.

FIG. 2 shows a highly reflective aluminum substrate 26 onto which light emitting diodes (LEDs) 27-32 have been mounted in a chip-on-board (COB) manner. The LED dies 27-32 are placed directly onto the substrate 26 in the die-bonding process. In one implementation, gold bond wires link the LED dies 27-32 in series, and the ends of the series-connected strings of LED dies are wire bonded to conductive traces deposited on the top surface of the aluminum substrate. In one embodiment, the top surface of the aluminum substrate is an insulating layer. The aluminum substrate 26 itself performs the functions of light reflection and heat dissipation. A luminaire made with the COB aluminum substrate 26 can be placed directly on a heat sink without any intervening printed circuit board layer. In another embodiment, substrate 26 has a base layer made of ceramic or a metal other than aluminum, such as copper.

Mounting the LED dies 27-32 directly onto an aluminum substrate that contacts a heat sink eliminates the manufacturing step of mounting the dies onto small aluminum substrates that are themselves attached to another substrate from which heat must be dissipated. The manufacturing cost of the COB aluminum substrate 26 is reduced by transferring the manufacturing steps of attaching and wire bonding the dies to the circuit board assembly stage.

However, highly reflective aluminum substrate 26 is still relatively expensive because of the multiple layers used to achieve the high reflectivity. Aluminum substrate 26 achieves a reflectivity exceeding 97%. Substrate 26 has a thicker base aluminum layer 33 with a thickness of 0.5 to 0.8 mm covered by a thinner 75-nm layer 34 of aluminum oxide ($Al_2O_3$). In some embodiments, the base aluminum layer 33 can be a coined rolled aluminum that has been mirror-finished at the time of rolling before it is silver plated. The aluminum oxide layer 34 is covered by a very thin layer 35 of titanium oxide ($TiO_2$) that separates a thicker layer of silver 36 from the aluminum oxide layer 34. The titanium oxide layer 35 is about one nanometer thick, and the silver layer 36 is about 170 nanometers thick. The titanium oxide layer 35 prevents the silver in layer 36 from migrating down into the base aluminum layer 33. The reflectivity of aluminum substrate 26 would be reduced if the silver in layer 36 were to become depleted through absorption into the base aluminum layer 33. The silver layer 36 is covered by a 45-nm insulating layer 37 of aluminum oxide, which itself is covered by a 45-nm reflective layer 38 of titanium oxide.

Layers 34 and 37 of aluminum oxide form insulating layers, and layers 36 and 38 of titanium oxide form reflective layers. But the silver layer 36 forms the primary reflector. Aluminum oxide layer 37 and titanium oxide layer 38 on top of silver layer 36 protect the silver film against corrosion. The optical thicknesses of layers 37-38 are chosen so that they do not reduce the reflectivity of silver layer 36. Other embodiments of aluminum substrate 26 can have more reflective layers to achieve an even higher reflectivity. For example, multiples pairs of layers with differing refractive indices may be deposited over the base aluminum layer 33 in order to form a distributed Bragg reflector on the aluminum substrate 26. The layers of the Bragg reflector may be placed above or below other single reflective layers. Each additional insulating and reflective layer adds to the cost of the highly reflective aluminum substrate 26. Thus, the cost can be reduced by covering only those surfaces of a luminaire with the expensive, highly reflective substrate 26 that are close to LED dies.

Figure 3:
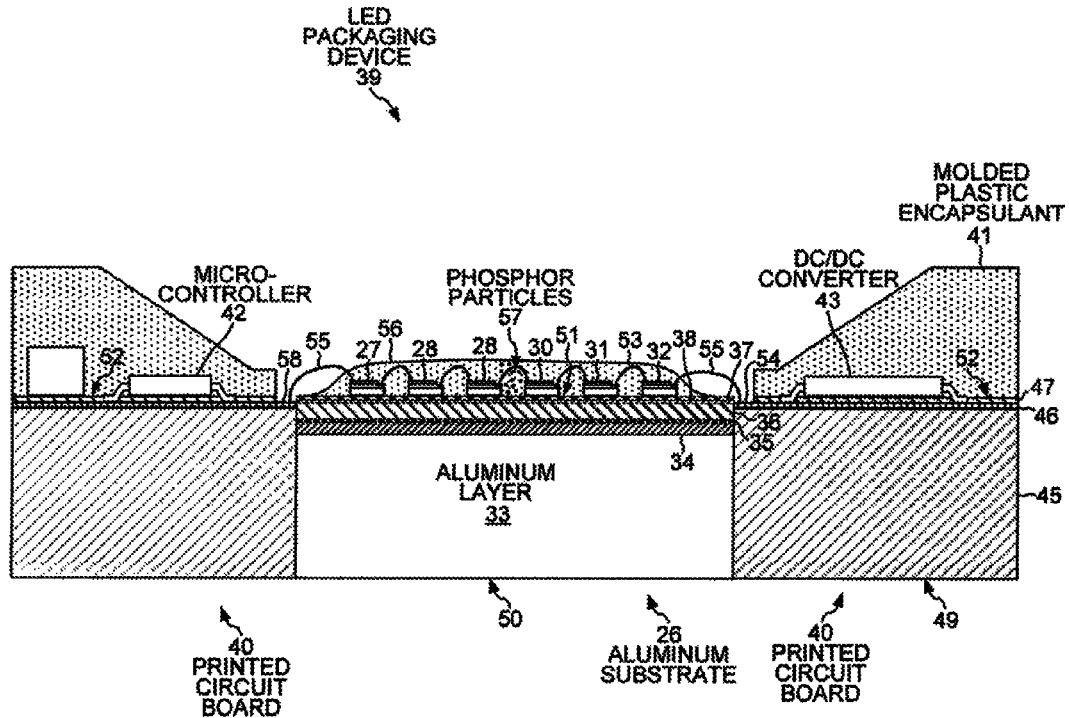
FIG. 3 is a cross-sectional view of an LED packaging device with LED dies mounted onto a highly reflective aluminum substrate inserted into a hole in a printed circuit board onto which electronic components are mounted.

FIG. 3 is a cross-sectional diagram of a low-cost device 39 for packaging LED dies that provides superior reflectivity and heat conductivity without covering entire surfaces of an LED module with the expensive highly reflective aluminum substrate 26. The device 39 includes the LED dies 27-32, the highly reflective substrate 26 and a printed circuit board 40. Drive electronics that control and power the LED dies are mounted onto the printed circuit board 40, and an insulative molded plastic encapsulant 41 encases and encapsulates the PCB 40 and the drive electronics. The drive electronics are electronic components, such as a microcontroller integrated circuit 42 and a switching DC-to-DC converter 43. In the example of FIG. 3, the switching DC-to-DC converter 43 is a buck converter. Thus, the drive electronics of the lighting module can receive a higher voltage and supply a lower voltage to the LED dies. Each of the electronic components is a packaged device that is in turn overmolded by the plastic encapsulant 41. The LED packaging device 39 together with the overmolded electronic components forms an integrated smart lighting module. The lighting module is "smart" because the drive electronics can supply a regulated constant current to the LED dies.

Each of the LED dies includes epitaxial layers of gallium-nitride grown on a sapphire substrate or on a substrate of crystalline silicon. The gallium-nitride LED dies emit blue light with a wavelength of about 450 nanometers when a sufficient drive current is passed through the diodes. In one embodiment, the printed circuit board 40 is a type of FR-4 board and has a layer 45 of glass fiber in resin, a metal layer 46 and a layer 47 of solder mask. The metal layer 46 is typically a copper foil with a thickness of less than 0.1 mm. The resin can be bismaleimide-triazine (BT) epoxy resin. In another embodiment, the printed circuit board 40 is a CEM-1 board (Composite Epoxy Material) with laminated paper sandwiched between glass fiber and resin and covered by copper foil.

Only small portions of the highly reflective aluminum substrate 26 below the LED dies are used in the LED packaging 39. The small portions of the COB aluminum substrate 26 are inserted into holes in the printed circuit board 40. The portions of substrate 26 can be circular, square or rectangular. In the embodiment of FIG. 3, the small portion of substrate 26 is a circular disk, and the hole in the printed circuit board 40 is cylindrical. After the substrate 26 is inserted into the hole in the printed circuit board 40, the lower surface 49 of the printed circuit board 40 and the bottom surface 50 of the substrate 26 are substantially coplanar. This allows the LED packaging 39 to establish a good thermal contact with the planar surface of a heat sink. In the embodiment of FIG. 3, the top surface 51 of the substrate 26 and the upper surface 52 of the printed circuit board 40 are also substantially coplanar.

The substrate 26 includes the insulating layer 37 disposed above the thicker base aluminum layer 33, and the reflective layer 38 disposed above the insulating layer 37. The LED dies 27-32 are mounted directly onto the top reflective layer 38. The LED dies 27-32 are electrically connected in series by bond wires 53. The ends of the series-connected string of LED dies 27-32 are wire bonded to conductors formed by the metal layer 46. A portion of the solder mask layer 47 on the printed circuit board 40 is removed to form a landing pad 54 for a bond wire 55 that electrically couples the metal layer 46 to the LED die 32, which is disposed on the top surface 51 of the substrate 26. No electrical connection is made to any of the LED dies 27-32 disposed on the top surface 51 of the substrate 26 except through a bond wire 53, 55. In the claims and this description, terms such as "upper", "lower", "top" and "bottom" are used to describe relative orientations between different parts of the LED device 39, and it is to be understood that the overall structure being described can actually be oriented in any way in three-dimensional space. When a first object is referred to as being disposed "over", "above" or "on" a second object, it is to be understood that the first object can be directly on the second object, or an intervening object may be present between the first and second objects.

A conformal layer of transparent carrier material 56, such as silicone or epoxy, covers the substrate 26 and the LED dies 27-32. Particles of phosphor 57 are suspended in the silicone 56. The phosphor 57 converts a portion of the blue light generated by the LED dies 27-32 into light in the yellow region of the optical spectrum. The combination of the blue and yellow light is perceived as "white" light by a human observer.

Figure 4:
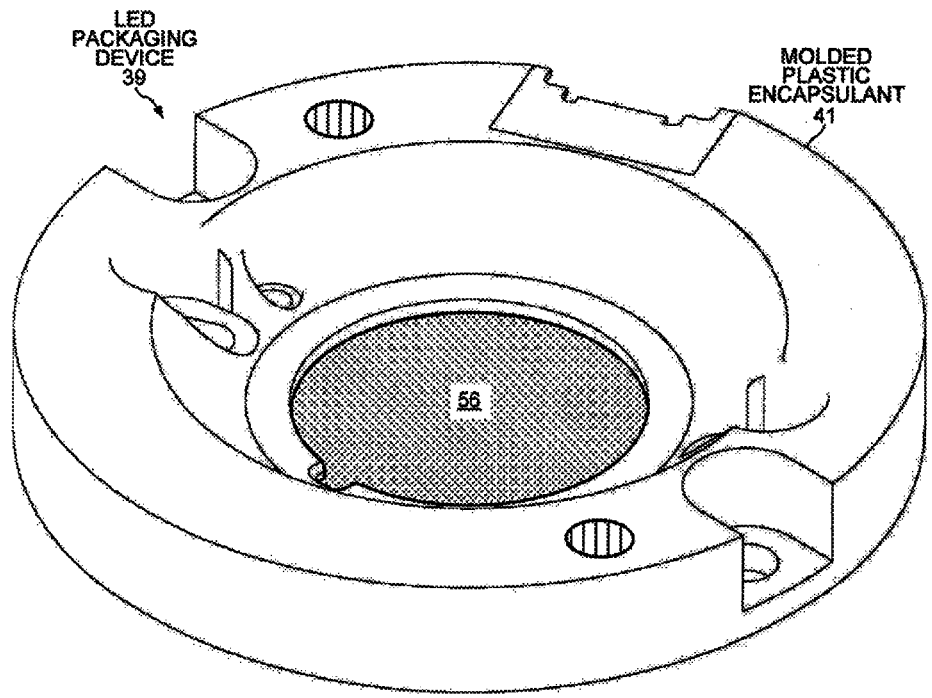
FIG. 4 is a perspective view of the LED packaging device of FIG. 3 covered by a plastic encapsulant that together with overmolded electronic components forms an integrated smart lighting module.
Figure 5:
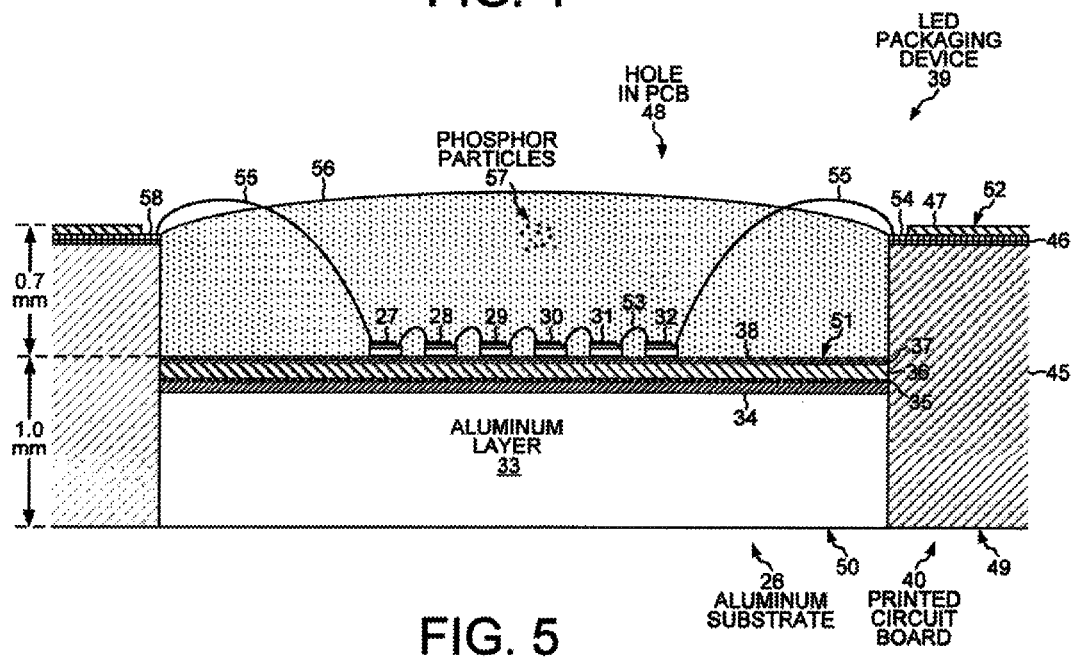
FIG. 5 shows an LED packaging device that includes LED dies mounted onto a highly reflective aluminum substrate inserted into a hole in a thicker printed circuit board.

FIG. 4 is a perspective view of the top of the integrated smart lighting module formed by encapsulating electronic components over the LED packaging device 39. The disk-shaped shaded object in the center of the module of FIG. 5 is the conformal silicone layer 56 with embedded phosphor particles. This silicone with the embedded phosphor particles overlies the LED dies 27-32. The LED dies are not visible in FIG. 4 because they are disposed under the silicone. The highly reflective aluminum substrate 26 is a disk that is disposed below the silicone layer 56.

FIG. 5 shows another embodiment of a low-cost LED packaging device 39 that provides superior reflectivity and heat conductivity without covering entire surfaces of a luminaire with expensive highly-reflective aluminum. The device 39 of FIG. 5 is similar to that of FIG. 3 except that a thicker printed circuit board 40 is used to make the luminaire. Because the thickness of the aluminum substrate 26 is typically less than one millimeter and the thickness of printed circuit board 40 is often more than one millimeter, the top surface 51 of the substrate 26 will be lower than the upper surface 52 of the printed circuit board 40. Nevertheless, the lower surface 49 of the printed circuit board 40 and the bottom surface 50 of the substrate 26 will be coplanar after the substrate 26 is inserted into the cylindrical hole 48 in the printed circuit board 40. Because the upper surface 52 of the printed circuit board 40 is higher than the top surface 51 of the substrate 26 on which the LED dies are mounted, an indentation is formed in the LED packaging device 39 above the LED dies 27-32. This indentation is filled with a layer of transparent carrier material 56 that covers the substrate 26 and the LED dies 27-32. Particles of phosphor 57 are also suspended in the silicone 56 of the embodiment of FIG. 5. In one embodiment, the hole 48 is overfilled such that the high viscosity of the silicone causes the layer to extend above the upper surface 52 of the printed circuit board 40 and to form the curve of a lens.

A larger disk of the aluminum substrate 26 is used in the embodiment of FIG. 5 than in the embodiment of FIG. 3. It is advantageous to use a large enough portion of substrate 26 with sufficient distance between the end LEDs 27, 32 and printed circuit board 40 so that the angle between the end LEDs 27, 32 and the top of the wall of the cylindrical hole 48 is less that 45 degrees. A lower angle between the end LEDs and the upper corners of the printed circuit board 40 will decrease the amount of light emitted by the LEDs that is absorbed by the walls of the printed circuit board.

Figure 6:
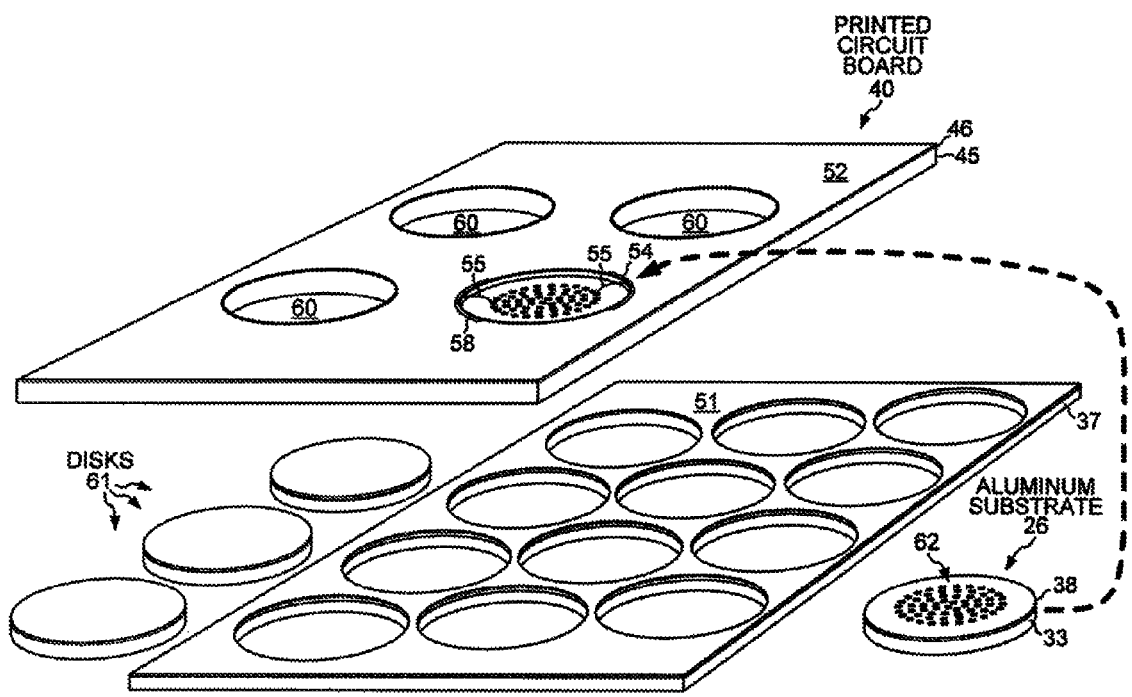
FIG. 6 is a perspective view of an aluminum substrate and a PCB illustrating how small portions of the aluminum substrate are inserted into holes in the PCB.

FIG. 6 is a perspective view of the printed circuit board 40 and the highly reflective substrate 26 illustrating how small portions of the COB aluminum substrate 26 are inserted into holes in the printed circuit board 40 to make the LED packaging device 39. In one embodiment, cylindrical holes 60 are cut into the printed circuit board 40 at locations where LED dies are desired in the LED luminaire. Disks 61 are cut from the aluminum substrate in a size to fit in the holes 60. The diameter of each of the disks 61 is slightly smaller than the diameter of each of the holes 60. The spacing between the disks cut from the aluminum substrate 26 is small to reduce the amount of holed substrate that is discarded. In another embodiment, small squares of the COB aluminum substrate 26 are inserted into square holes in the printed circuit board 40 to make the LED packaging device 39. None of the aluminum substrate 26 remains to be discarded after the substrate is cut into squares as opposed to disks.

In embodiments in which the top surface 51 of the substrate 26 and the upper surface 52 of the printed circuit board 40 are coplanar in the finished LED packaging device 39, the LED dies 62 can be mounted onto the top surface of the aluminum substrate 26 after the portions of substrate are inserted into the holes in the PCB 40. In other embodiments, LED dies 62 are first mounted directly onto the top surface 51 of the top reflective layer 38 of the COB aluminum substrate 26 before the disks 61 are cut from the substrate 26. The LED dies 62 are mounted in the pattern used in the LED packaging device 39. For example, the LED device 39 being made in FIG. 6 includes an array of sixty LED dies 62. FIG. 6 shows an aluminum substrate 26 inside a hole 60 in PCB 40 with the top surface 51 of the substrate lower than the upper surface 52 of the PCB. Strings of LED dies are electrically connected in series by bond wires. For example, ten LED dies across the middle of the circular array are connected in series such that a drive current can flow from a positive landing pad 54 on PCB 40 through the LED dies to a negative landing pad 58 on PCB 40. The LED dies at the ends of each string are connected to the landing pads 54, 58 on PCB 40 by bond wires 55.

Figure 7:
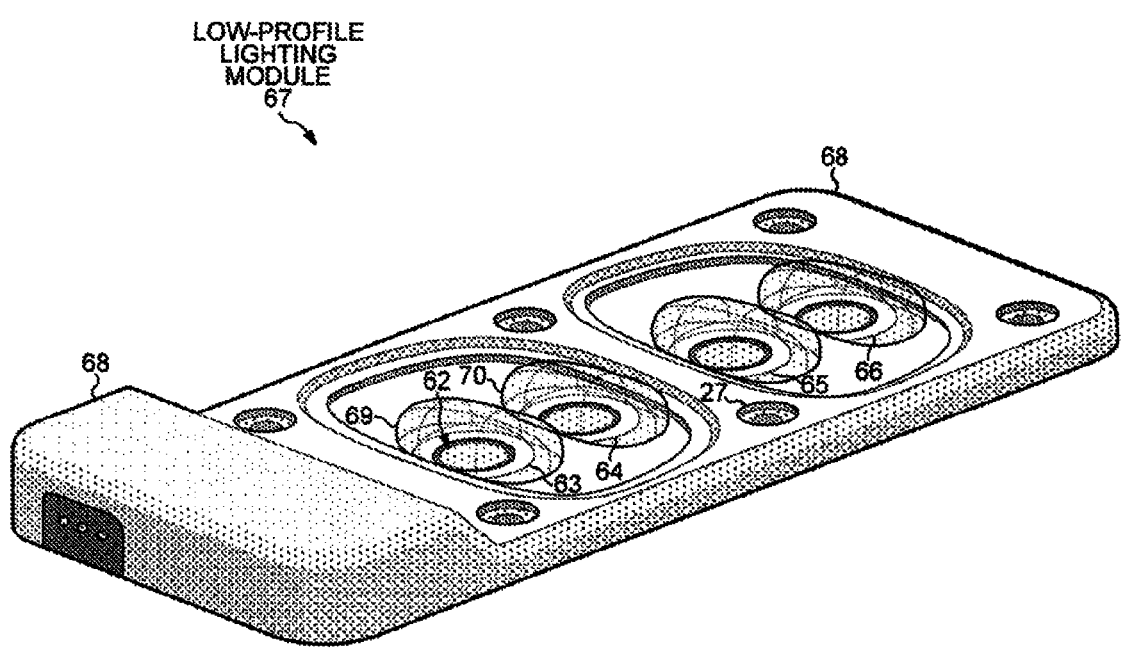
FIG. 7 shows the LED packaging device of FIG. 5 used in a low-profile, outdoor lighting module.

FIG. 7 shows the LED packaging device 39 used in a luminaire intended for outdoor lighting purposes. LED device 39 includes four disks 63-66 of the highly reflective aluminum substrate 26 embedded in the PCB 40. The luminaire is a low-profile lighting module 67 that is suitable for use in street lights, under the canopies of gas stations, on the metal siding of buildings and in bay lights in warehouses and big box stores. Module 67 has limited space requirements because of its low profile. For example, the flat body of module 67 is less than seven millimeters thick. Because module 67 is so thin, it fits in most street lights in the space that would otherwise be occupied by conventional high-pressure sodium (HPS) bulbs. No solder or screws are used to attach the molded-plastic cover 68 to the printed circuit board 40 on which the components are mounted. The six holes in module 67 shown in FIG. 7 are used to screw the module to a street lamp, metal siding or other heat sink. An array of LED dies 62 is mounted on each of the four disks 63-66, and an optical lens 69 is disposed over each LED array. For additional details on the low-profile outdoor lighting module 67, see U.S. patent application Ser. No. 14/229,903 entitled "Low-Profile Outdoor Lighting Module With Light Emitting Diodes," filed on Mar. 29, 2014, which is incorporated herein by reference.

Figure 8:
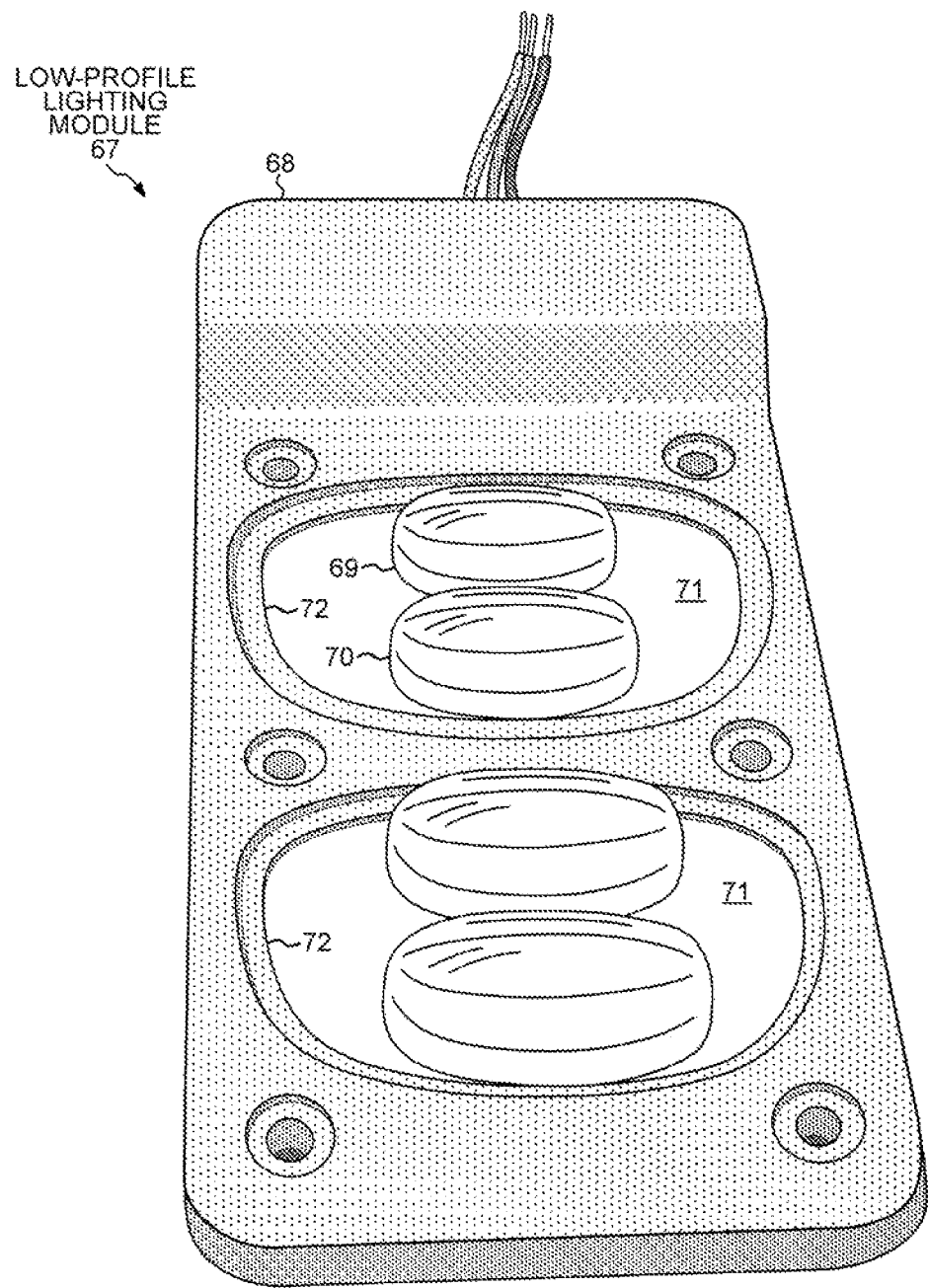
FIG. 8 is a different perspective view of the outdoor lighting module of FIG. 7.

FIG. 8 is a different perspective view of low-profile lighting module 67 of FIG. 7. FIG. 8 also shows that pairs of lenses 69-70 are integrally attached together by a flat portion 71 of the lens material. The edge of each flat portion 71 fits under the lip 72 of openings in cover 68.

Figure 9A:
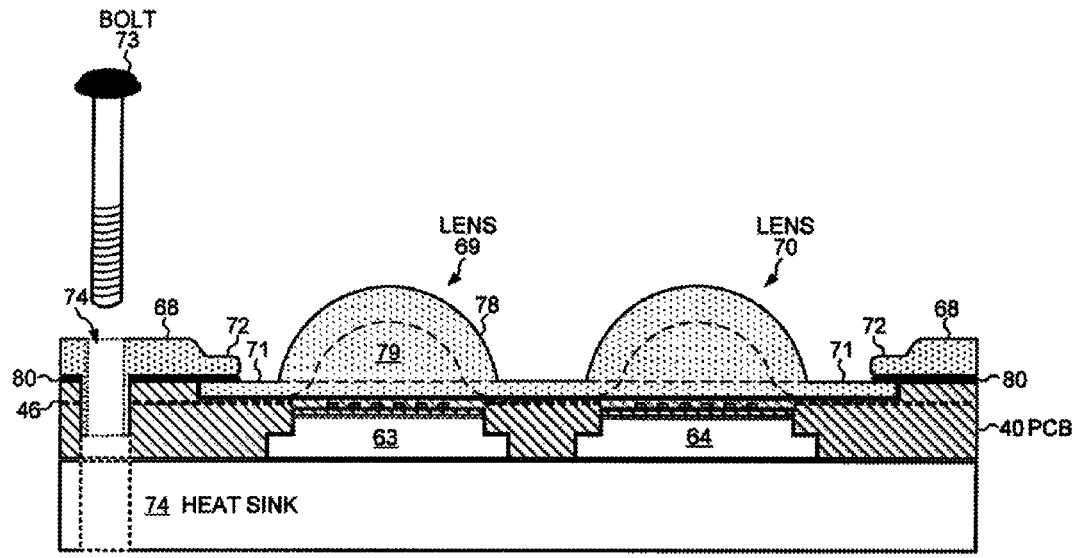
FIG. 9A is a longitudinal cross-sectional view through the LED packaging device of FIG. 5 used in the lighting module of FIG. 7.
Figure 9B:
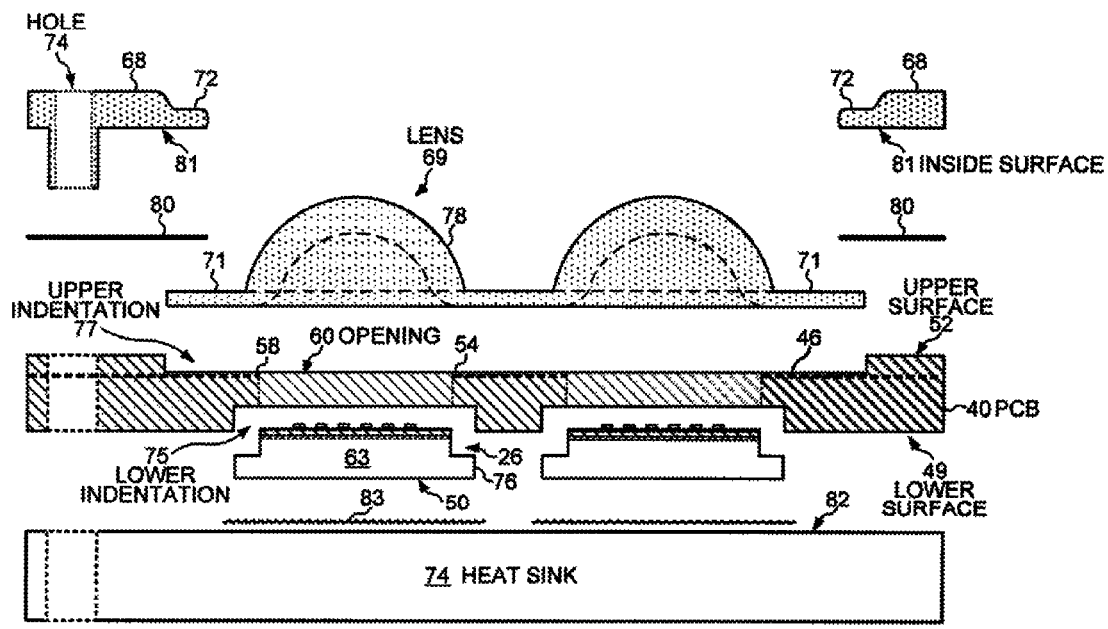
FIG. 9B is an exploded view of the elements of the LED packaging device and lighting module shown in FIG. 9A.

FIG. 9A is a longitudinal cross-sectional view of a portion of module 67 through two disks 63-64 of LED packaging device 39. The elements of FIG. 9A are shown in an exploded view in FIG. 9B for clearer labeling. FIG. 9A shows a bolt 73 used to attach module 67 to a heat sink 74. Bolt 73 passes through a hole 74 in the molded-plastic cover 68. FIGS. 9A-9B illustrate how the aluminum substrate 26 of the disks 63-64 fits up into the cylindrical openings 60 in the printed circuit board (PCB) 40 that forms the base of module 67. The diameter of the opening 60 is somewhat greater near the lower surface 49 of PCB 40, which forms a lower indentation 75 in the lower surface 49. The upper portion of the walls of each disk 63 are ground to decrease the diameter at the top of the disk 63 and to form a lower lip 76. The lower lip 76 of each disk 63 fits up into the lower indentation 75, and the diameter at the top of the disk 63 is only slightly smaller than the diameter of each of the openings 60. Each disk 63-64 is held into an opening 60 by the friction between the walls of the openings 60 and the upper edges of the disk. In addition, each COB aluminum substrate 26 is mechanically attached to PCB 40 by and adhesive and sealant that lines the lower indentation 75.

There is also an upper indentation 77 located in the upper surface 52 of PCB 40. The flat portion 71 of the lenses 69-70 fits into upper indentation 77 and is held in place by the lip 72 around openings in cover 68. FIG. 9B shows the curved optical portion 78 and the flat portion 71 of lens 69. The peripheral edge of the flat portion 71 is pressed down into upper indentation 77 by the lip 72 around the opening in cover 68. Lens 69 has a hollow dome 79 beneath the curved optical portion 78.

The molded-plastic cover 68 is attached to the upper surface 52 of PCB 40 by a double-sided adhesive sheet 80. Adhesive sheet 80 attaches the inside surface 81 of cover 68 to both the upper surface 52 of PCB 40 and to the flat portion 71 of the lenses 69-70. Because adhesive sheet 80 covers both the upper surface 52 of PCB 40 and the flat portion 71 of lenses 69-70, a water-tight seal is created over the groove between the lenses and PCB 40. Thus, moisture is prevented from entering module 67 from the light emitting side. Moisture is also prevented from entering module 67 through the lower indentation 75 in PCB 40 by forming a room-temperature vulcanizing (RTV) rubber seal in the channel between substrate 26 and the walls of the lower indentation 75. The rubber is dispensed into the channel after substrate 26 has been inserted into the lower indentation 75. Thus, module 67 is weatherized and can withstand harsh outdoor usage, such as being bolted to the aluminum siding of a building without being protected under a canopy or roof.

When highly reflective substrate 26 is mounted up into lower indentation 75, the bottom surface 50 of substrate 26 is substantially coplanar with lower surface 49 of PCB 40. In this manner, the bottom side of module 67 can be mounted to the planar surface 82 of heat sink 74 to achieve a good thermal contact. To improve the thermal coupling between module 67 and heat sink 74, a thermal interface material 83 can optionally be used. In this case, substrate 26 is thermally coupled through the thermal interface material 83 to heat sink 74. Thermal interface material 83 is placed on upper surface 82 of heat sink 74, and lower surface 49 of PCB 40 contacts thermal interface material 83. In one implementation, thermal interface material 83 is thermal grease, and module 67 is attached to heat sink 74 by bolts 74. In another implementation, thermal interface material 83 is thermal glue that adheres lower surface 49 of PCB 40 to upper surface 82 of heat sink 74. No bolts are required when thermal glue is used. Any small deviations of surfaces 27 and 49 from being exactly planar are compensated by the thickness of the thermal interface material.

Figure 10:
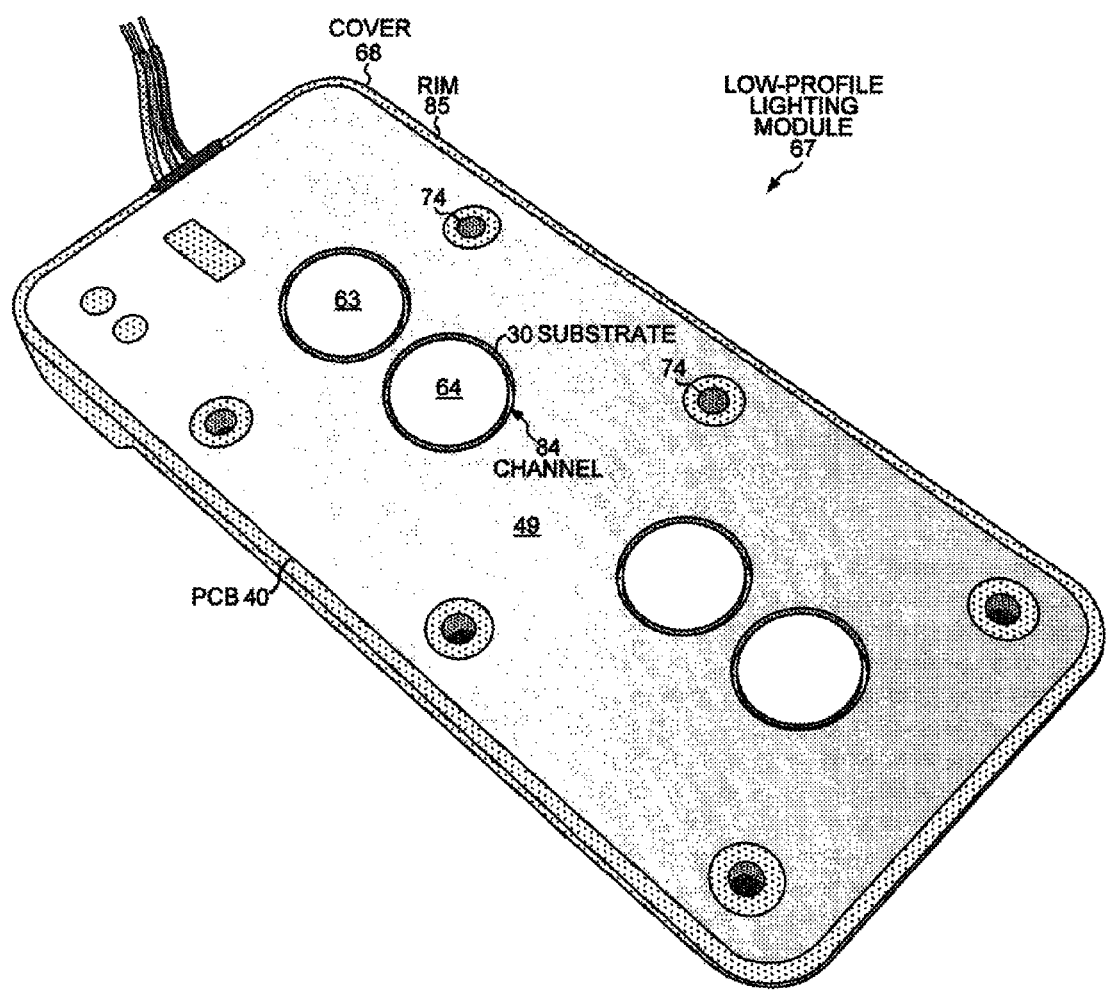
FIG. 10 shows the bottom side of the lighting module of FIG. 7.

FIG. 10 shows the bottom side of low-profile lighting module 67 that is attached to heat sink 74. FIG. 10 shows the RTV rubber seal in a channel 84 between substrate 26 and the walls of lower indentation 75. Although the bottom rim 85 of molded-plastic cover 68 is not sealed to the sides of PCB 40, moisture cannot enter between upper surface 52 of PCB 40 and inside surface 81 of cover 68 due to the seal formed by double-sided adhesive sheet 80. Similarly, moisture is prevented from reaching upper surface 52 of PCB 40 from round the plastic surrounding the holes 74 by the seal formed by adhesive sheet 80.

Figure 11:
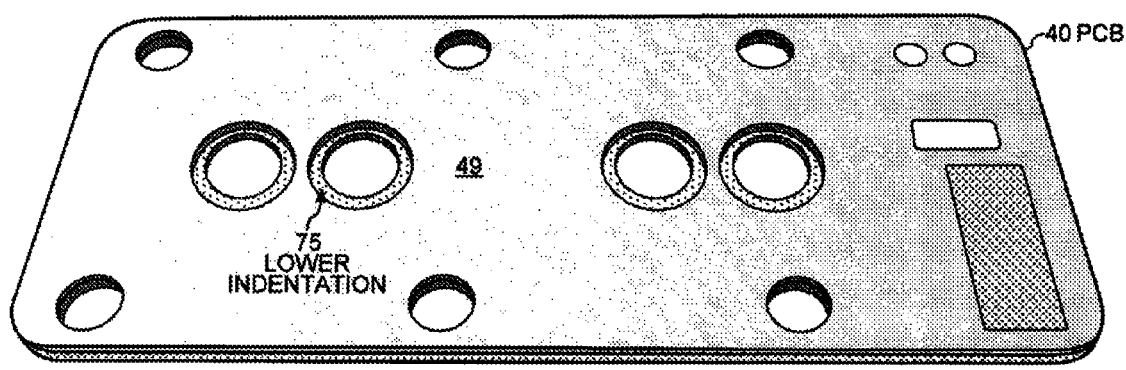
FIG. 11 shows the lower surface of a PCB before disks of a reflective aluminum substrate are inserted into openings in the PCB.

FIG. 11 shows lower surface 49 of PCB 40 before each disk 63-64 of the highly reflective substrate 26 is inserted up into an openings 60 and a lower indentation 75 in the lower surface 49.

Figure 12:
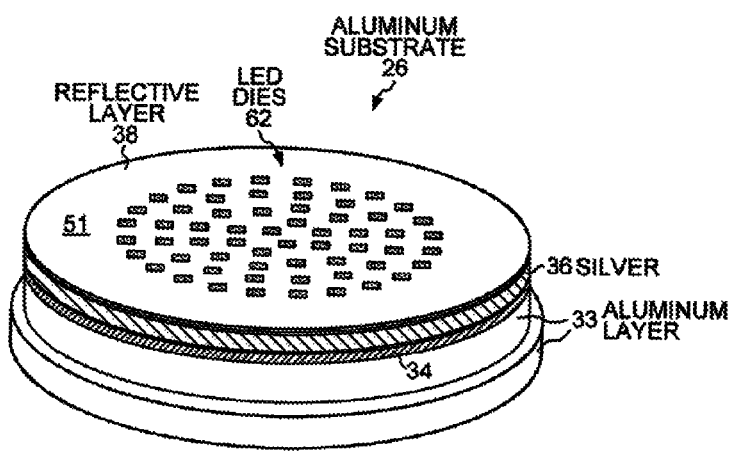
FIG. 12 shows a disk of a reflective aluminum substrate with mounted LED dies before it is inserted into an opening in a PCB.

FIG. 12 shows a disk 63 of highly reflective substrate 26 before the disk is inserted into an opening 60. FIG. 12 also shows the LED dies 62 that are directly attached to the top surface 51 of the substrate 26 on the reflective layer 38.

Figure 13:
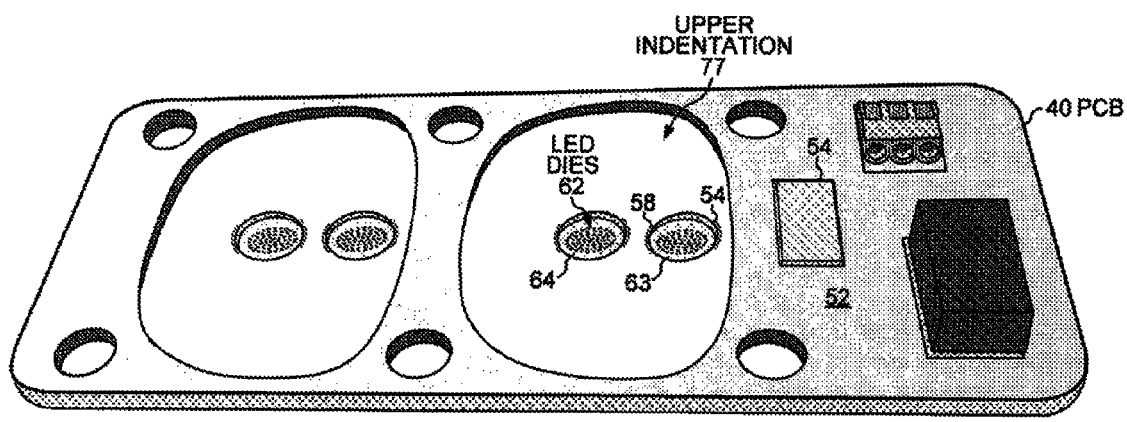
FIG. 13 shows the top side of a PCB after disks of an aluminum substrate have been inserted from the bottom into openings in the PCB.

FIG. 13 shows PCB 40 from the top side after the disks 63-64 of substrate 26 have been inserted from the bottom into the openings 60. The landing pads 54, 58 at the upper edges of the openings 60 are formed by exposed portions of metal layer 46. The top surface 51 of each disk 63-64 is lower than the surface of PCB 40 at the bottom of upper indentation 77. The indentation formed by the lower top surface 51 of each disk 63-64 is filled with silicone 56 containing phosphor particles. The silicone is poured into the indentation and hardens forming a conformal covering over the LED dies 62.

FIG. 13 also shows a plurality of electronic components, including drive electronics, are mounted onto PCB 40. The drive electronics are electrically coupled to the LED dies 62 through the metal layer 46 of PCB 40 and the landing pads 54, 58. A structure 54 contains electronic components that power and control the LED dies 62. In the embodiment of FIG. 13, the electronic components in structure 54 can be damaged by excessive heat. By using a composite substrate with aluminum disks inserted into holes in an FR-4 printed circuit board as opposed to a complete COB aluminum substrate, the amount of heat that flows from the heat sink back up to the electronic components can be reduced. If the structure 54 were mounted on an aluminum board that is in contact with the head sink 74, then the temperature of the electronic components might increase if the LED dies 62 generate such large amounts of heat that the heat sink 74 cannot dissipate that heat before the temperature of the heat sink increases. The glass and resin of PCB 40 insulate the structure 54 from heat that might otherwise be transferred from the LED dies 62, through the COB aluminum substrate 26, to the heat sink 74 and back up to the structure 54.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
a substrate with a top surface and a bottom surface, wherein the substrate includes an insulating layer, a reflective layer and a metal layer, and wherein the insulating layer and the reflective layer are disposed above the metal layer; and
a printed circuit board with a metal layer, a lower surface, and an upper surface, wherein the substrate is disposed in an opening in the printed circuit board, and wherein the lower surface of the printed circuit board and the bottom surface of the substrate are substantially coplanar.

2. The device of claim 1, wherein the substrate has a reflectivity of greater than 97%.

3. The device of claim 1, further comprising:
a light emitting diode (LED) die disposed on the top surface of the substrate, wherein the metal layer is electrically coupled to the LED die through a bond wire.

4. The device of claim 1, wherein no electrical connection is made to any LED die disposed on the top surface of the substrate except through a bond wire.

5. The device of claim 1, wherein the top surface of the substrate and the upper surface of the printed circuit board are coplanar.

6. The device of claim 1, wherein the top surface of the substrate is lower than the upper surface of the printed circuit board.

7. The device of claim 1, further comprising:
a light emitting diode (LED) die disposed on the top surface of the substrate; and
a layer of silicone that covers the substrate and the LED die, wherein particles of phosphor are contained in the layer of silicone.

8. The device of claim 1, further comprising:
a light emitting diode (LED) die disposed on the top surface of the substrate; and
electronic circuitry disposed on the upper surface of the printed circuit board, wherein the electronic circuitry is used to control light emitted from the LED die.

9. The device of claim 1, further comprising:
a light emitting diode (LED) die disposed on the top surface of the substrate; and
drive electronics disposed on the upper surface of the printed circuit board, wherein the drive electronics receive a higher voltage and supply a lower voltage to the LED die.

10. A device comprising:
a light emitting diode (LED) die;
a highly reflective substrate with a top surface and a bottom surface, wherein the LED die is disposed on the top surface of the substrate, wherein the substrate includes an insulating layer, a reflective layer and a metal layer, and wherein the insulating layer and the reflective layer are disposed above the metal layer; and
a printed circuit board with a metal layer, a lower surface, and an upper surface, wherein the substrate is disposed in an opening in the printed circuit board, wherein the lower surface of the printed circuit board and the bottom surface of the substrate are substantially coplanar, and wherein the metal layer is electrically coupled to the LED die.

11. The device of claim 10, wherein the top surface of the substrate is lower than the upper surface of the printed circuit board.

12. The device of claim 10, wherein the printed circuit board has a lower indentation in the lower surface, wherein the lower indentation has a depth, wherein the substrate has a lower lip with a thickness, and wherein the thickness of the lower lip equals the depth of the lower indentation.

13. The device of claim 10, further comprising:
a cover of molded plastic with an inside surface, wherein a double-sided adhesive sheet is disposed under the inside surface of the cover and over the upper surface of the printed circuit board.

14. The device of claim 13, further comprising:
drive electronics disposed between the upper surface of the printed circuit board and the inside surface of the cover.

15. The device of claim 10, further comprising:
a heat sink with an upper surface; and
a thermal interface material, wherein the bottom surface of the substrate contacts the thermal interface material, and wherein the upper surface of the heat sink contacts the thermal interface material.

16. The device of claim 10, further comprising:
a double-sided adhesive sheet;
a cover of molded plastic with an inside surface, wherein the adhesive sheet is disposed under the inside surface of the cover and over the upper surface of the printed circuit board; and
a lens with a planar lower surface and a flat portion, wherein the adhesive sheet is disposed under the inside surface of the cover and over both the upper surface of the printed circuit board and the flat portion of the lens.

17. A device comprising:
a light emitting diode (LED) die;
a printed circuit board having a metal foil conductor, a lower surface, and an upper surface, wherein an opening is disposed in the printed circuit board; and
a means for reflecting light emitted by the LED die, wherein the means includes an insulating layer and a reflective layer disposed above a metal substrate, wherein the means is disposed in the opening, wherein the LED die is mounted directly to the top surface of the means, wherein the lower surface of the printed circuit board is substantially coplanar with a bottom surface of the means, and wherein the conductor is connected to the LED die.

18. The device of claim 17, wherein no electrical connection is made to any LED die disposed on the top surface of the means except through a bond wire.

19. The device of claim 17, further comprising:
a layer of silicone that covers the means and the LED die, wherein particles of phosphor are contained in the layer of silicone.

20. The device of claim 19, wherein the layer of silicone extends above the upper surface of the printed circuit board.

* * * * *